United States Patent
Huang

(12) 
(10) Patent No.: US 6,235,567 B1
(45) Date of Patent: May 22, 2001

(54) SILICON-GERMANIUM BICMOS ON SOI

(75) Inventor: Feng-Yi Huang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/387,326

(22) Filed: Aug. 31, 1999

(51) Int. Cl.$^7$ ................................................ H01L 21/8238
(52) U.S. Cl. .................... 438/202; 438/205; 438/235; 438/152; 438/311; 438/404
(58) Field of Search .................... 438/202, 234, 438/311, 355, 404, 189, 191, 312, 205, 235, 152

(56) References Cited

U.S. PATENT DOCUMENTS 5,100,810 * 3/1992 Yoshimi et al. .
5,102,809 * 4/1992 Eklund et al. .
5,593,915 * 1/1997 Ohoka .
5,952,695 * 9/1999 Ellis-Monaghan et al. .

* cited by examiner

Primary Examiner—Tuan H. Nguyen
(74) Attorney, Agent, or Firm—Eric W. Petraske

(57) ABSTRACT

A BiCMOS integrated circuit is formed with CMOS transistors on an SOI substrate in a silicon layer having a standard thickness of 0.1 $\mu$m to 0.2 $\mu$m and with Bipolar SiGe transistors formed in an epitaxial layer nominally 0.5 $\mu$m thick. The CMOS transistors are formed first with standard processing, then covered with an insulating film. The insulating film is stripped in the bipolar areas and an epitaxial SiGe layer is deposited on the Si substrate. The bipolar transistors are formed using the SiGe epi layer for the base and having an encapsulated structure for device isolation using shallow isolation trenches and the buried oxide.

16 Claims, 5 Drawing Sheets

SILICON-GERMANIUM BICMOS ON SOI

TECHNICAL FIELD

The field of the invention is silicon on insulator (SOI) integrated circuits incorporating BiCMOS circuitry.

BACKGROUND OF THE INVENTION

SiGe (silicon-germanium alloy) heterojunction bipolar transistors (HBTs) integrated with standard silicon CMOS forming the so-called SiGe BiCMOS circuits have been developed for analog/mixed signal applications in high-speed wireless and wired network communications. In SiGe BiCMOS, the base layer of the HBT is formed from SiGe alloy, different from conventional Si-only bipolar transistors which have a silicon base. Because of the narrow bandgap of SiGe alloy compared with the bandgap of the silicon emitter, the base layer can be highly doped to reduce the parasitic resistance without sacrificing the emitter efficiency. As a result, SiGe HBTs exhibit higher response frequency and higher gain as compared to the Si counterpart.

A major development in the silicon CMOS technology is the use of silicon-on-insulator (SOI) substrates which are now available commercially.

The integration of BiCMOS with SOI circuits opens another regime of high performance circuits also having low power consumption. Various integration schemes have been proposed previously; e.g. in U.S. Pat. No. 5,587,599 "Bipolar transistor and manufacturing method", which disclosed a CMOS compatible bipolar transistor on an SOI substrate.

Some other prior publications such as S. Parke, et al., "A versatile SOI BiCMOS technology with complementary lateral BJT's," IEEE IEDM 92, 453–456 (1992), also provided similar schemes.

For technologies utilizing the shallow trench isolation and planarization approach, the integration of SOI with SiGe BiCMOS suffers from the problem of processing compatibility. For partially depleted SOI silicon CMOS, the thin silicon film on top of the buried oxide should be about 0.1 $\mu$m to 0.2 $\mu$m thick, whereas the thickness of the silicon collector in the SiGe HBT (underneath the SiGe base layer) should be about 0.5 $\mu$m, substantially thicker than the CMOS silicon.

It is therefore the objective of the present disclosure to provide an integration scheme to fabricate SiGe HBT on a partially depleted silicon SOI CMOS circuits.

SUMMARY OF THE INVENTION

The invention relates to an integrated BiCMOS circuits on SOI, in which the bipolar transistors are formed with a silicon-germanium (SiGe) alloy base and an epitaxial silicon collector. The collector thickness is much thicker than the Si device layer in the SOI wafer.

An optional feature of the invention is the use of selective implantation of oxygen atoms for the buried oxide layer so that some or all of the bipolar transistors may be separated from the SOI region.

A feature of the invention is the use of shallow trench isolation on two levels—in the device layer to isolate the CMOS devices, and in the epitaxial silicon collector layer to provide isolation between base and collector junctions within one HBT device, as well as isolation between different devices.

An added feature of using the shallow trench is the complete isolation of bipolar device from the substrate by etching the shallow trench between devices down to the buried oxide. This eliminates the costly use of deep trench isolation to reduce device coupling to the substrate in the prior art.

DESCRIPTION OF THE PREFERRED EMBODIMENTS

Figure 1:
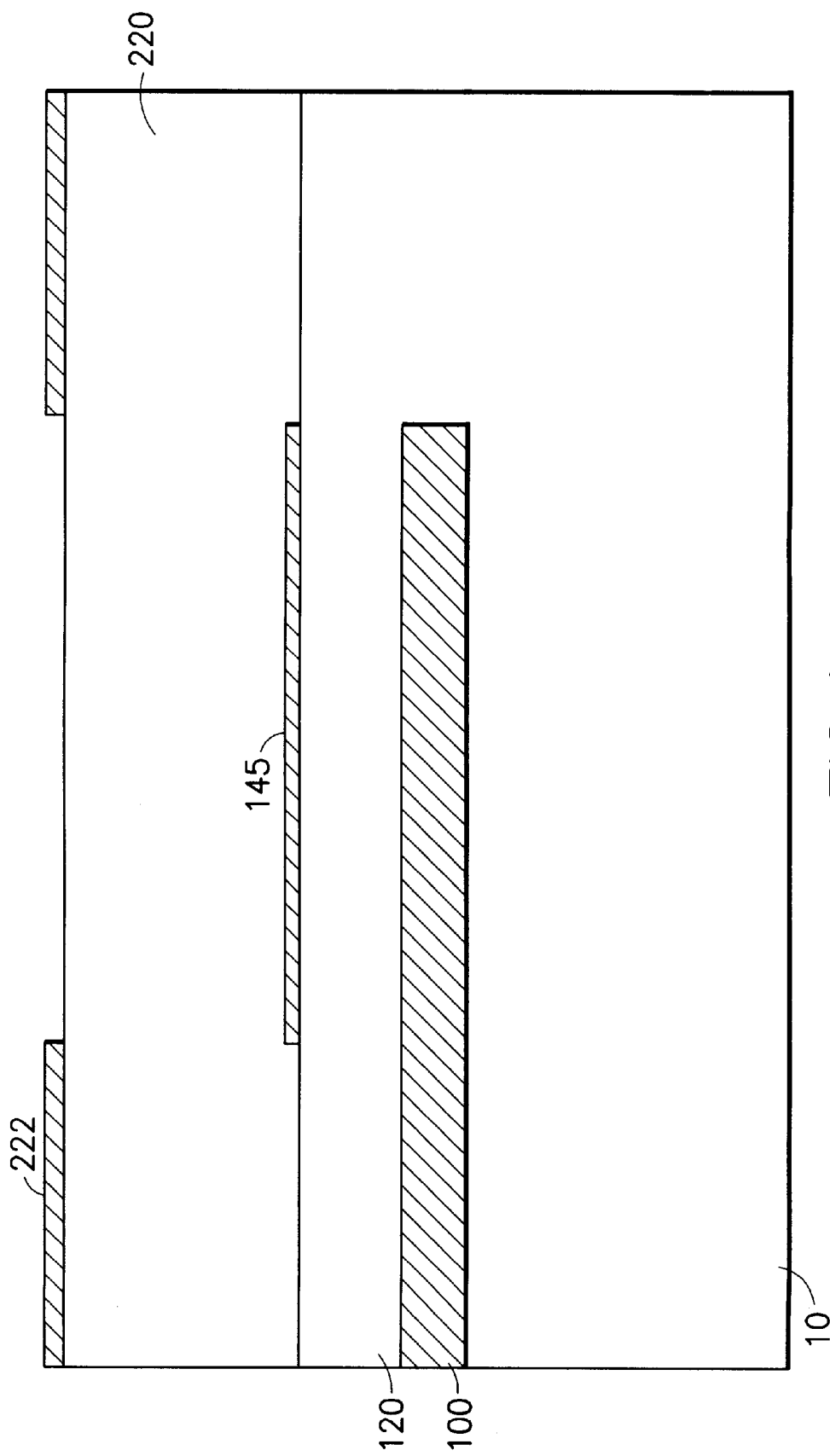
FIGS. 1–5 illustrate a portion of an integrated circuit at various steps of the process.

Referring now to FIG. 1, there is shown a portion of an integrated circuit after the completion of preliminary steps. A silicon wafer 10 has a buried oxide insulating layer 100 formed below a device layer 120 of crystalline silicon. The buried layer can be formed by any convenient method, but SIMOX (Separation by Implantation of OXide) is preferred. Layer 100 does not extend entirely across the circuit and an optional feature of the invention is that portions of the bipolar area may be blocked during oxygen implantation in order to put bipolar transistors over the bulk silicon instead of over the buried oxide. Additional preparatory steps, such as implantation of the device layer to form transistor bodies of the desired polarity and deposition of pad oxide and nitride are included along with forming the buried layer in the term "preparing the substrate". Such steps may be performed before or after the deposition of epitaxial layer 220 or after it has been removed in the CMOS transistor area.

An epitaxial deposition of silicon at a temperature of about 1050° C. has deposited silicon layer 220, nominally 0.5 $\mu$m or thicker and doped n-type, that will form the collectors of the bipolar transistors. On the right and left of the Figure, protective layer 222 covers two areas that will contain a bipolar transistor. Protective layer 145 in the center defines a CMOS area. Layers 145 and 222 may be any convenient material such as nitride ($Si_3N_4$), oxide ($SiO_2$) or a combination of both that will protect the crystal surface to provide good crystal structure for the subsequent CMOS transistor formation and for epitaxial deposition of a SiGe (silicon-germanium alloy) base for the bipolar transistors.

Figure 2:
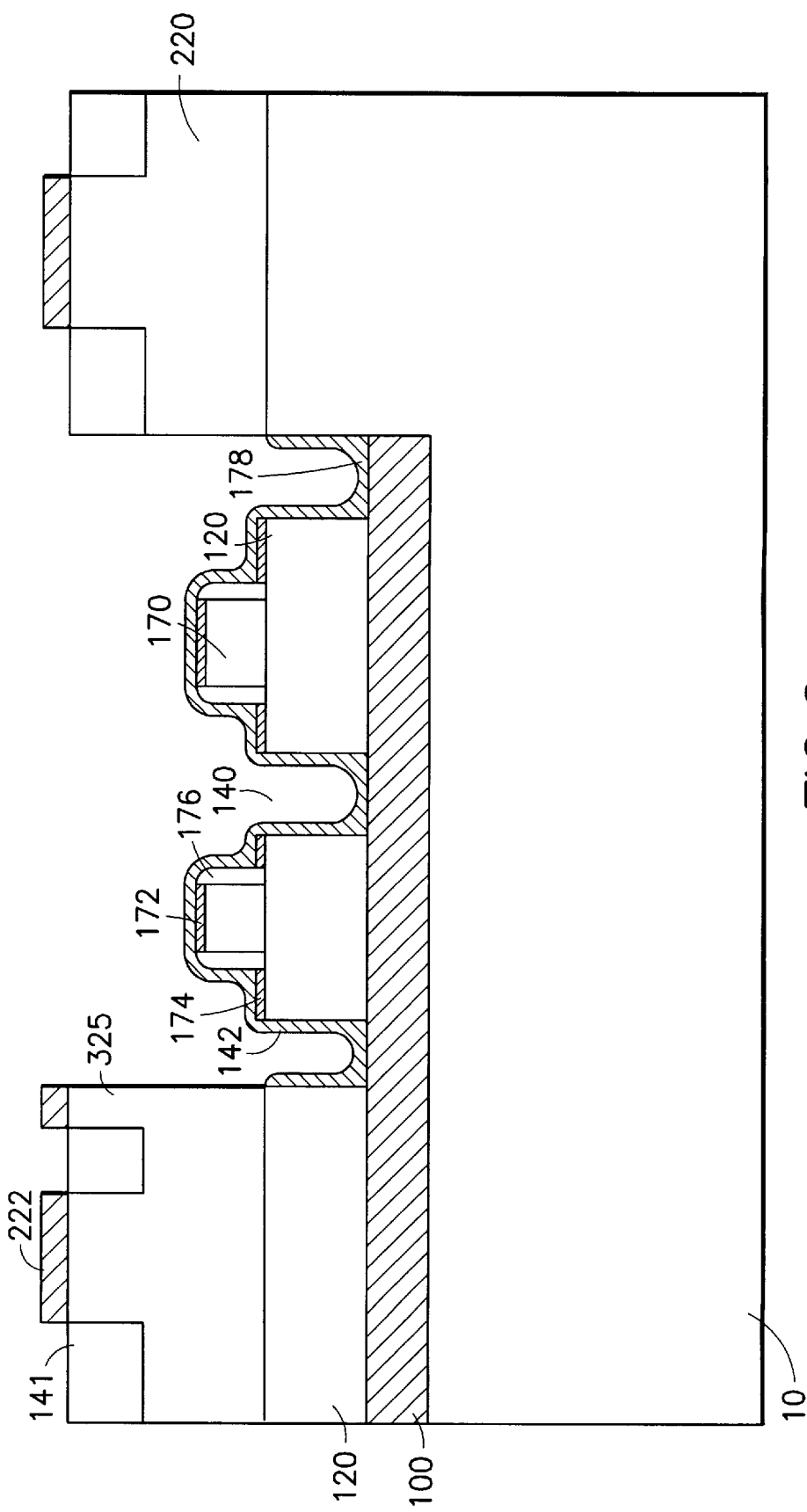

Referring now to FIG. 2, silicon layer 220 above the CMOS area has been removed, using layer 145 as an etch stop and two sets of shallow isolation trenches (STI) have been formed by patterning the nitride layers to expose the trench area, then etching in a conventional process. The remainder of layer 145 has been stripped and a set of CMOS field effect transistors (p-type and n-type) has been formed by a conventional CMOS process in the CMOS region of the wafer, having gates 170, sidewalls 176 for the formation of a low-doped drain, and salicide areas 174 above the source and drain and 172 above the gate. Any conventional transistor formation process may be used. Simultaneous formation of the upper STI 141 and the lower STI 140 is optional and the upper STI may be formed later if that is desired. A protection layer 142, preferably SiN, is deposited above the CMOS area, which also serves as an etch stop for a later contact opening etch.

The STI 140 for CMOS can also be formed before the collector epitaxial silicon deposition, and planarized by chemical-mechanical polishing (CMP), not shown in the Figure, as a part of the substrate preparation.

The preferred thickness of the collector layer is about 0.5 $\mu$m to ensure proper breakdown voltage. Since the preferred thickness of the device layer for partial depletion of the CMOS transistors is about 0.1 $\mu$m–0.2 $\mu$m, the epitaxial layer is required in order to get the correct thickness for the bipolar transistors.

Figure 3:
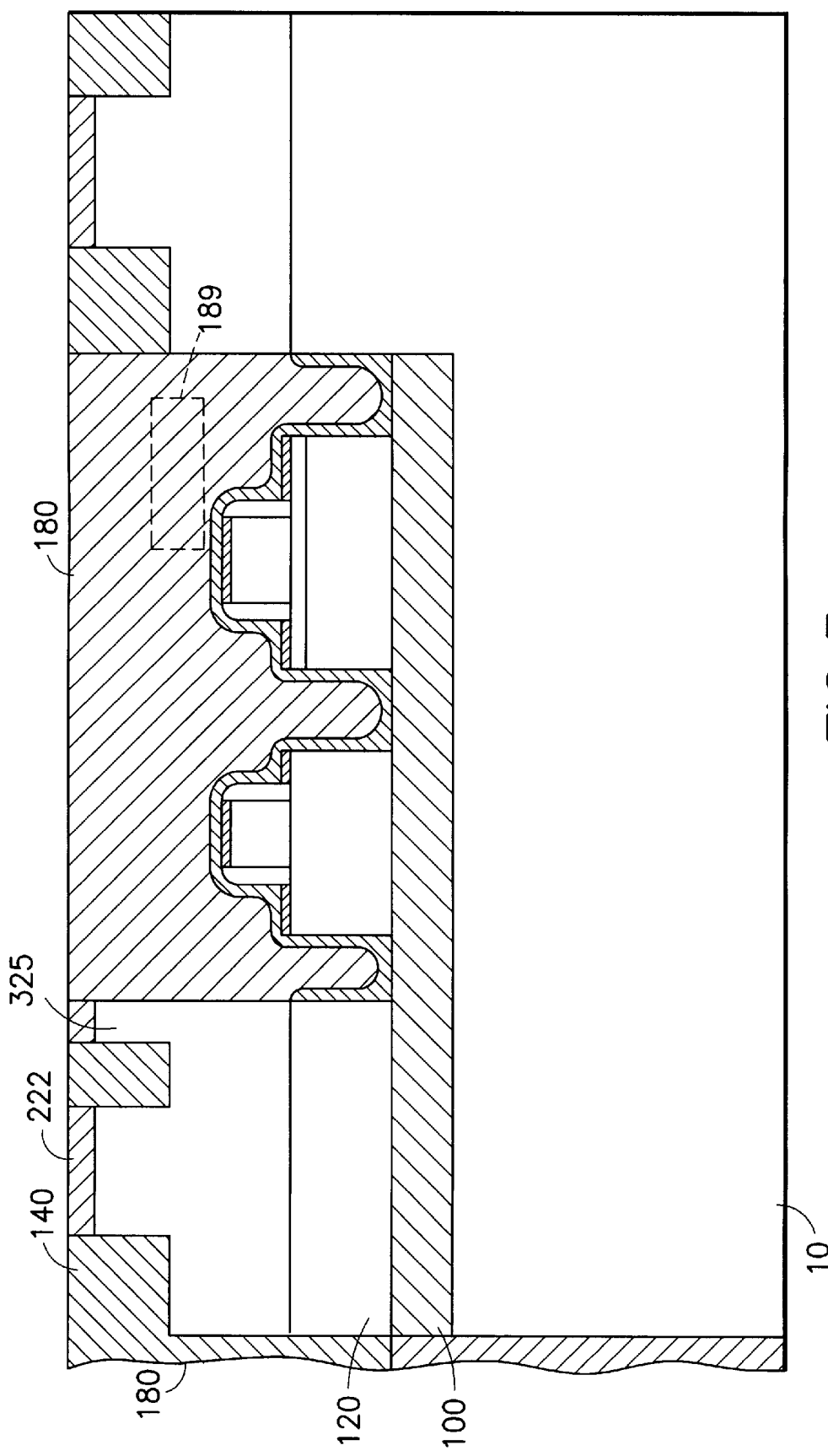

Next, as in FIG. 3, the space above the CMOS region, is covered with an insulating layer 180, preferably TEOS (tetra-ethyl ortho-siloxane) and the TEOS is polished to the level of polish stop 222. This insulating layer fills trenches 140, the area between the CMOS transistors and the area above the transistors in the CMOS region and the secondary STI 141.

After the planarization, the remainder of layer 222 is stripped and an epitaxial deposition of SiGe alloy is put down by a process such as molecular beam epitaxy (MBE), ultra-high vacuum chemical vapor deposition (UHV-CVD), or gas-source MBE, etc. The SiGe alloy base is illustratively 100 nm thick. The Ge content in the SiGe alloy base is typically 10%–20%, which is limited by the allowed critical thickness for high quality epitaxial growth of strained SiGe on Si. The Ge content in the base layer can be graded to form an internal electrical field to accelerate carrier transport through the base region, and hence increase device response speed.

If a selective epitaxial growth of SiGe alloy is used, e.g., via gas source MBE or UHVCVD, such that SiGe alloy only grows on the area of crystalline silicon collector not on layer 180 in the STI and over the CMOS region, the base is self-aligned to the collector, and no etch back is needed. If a blanket deposition is used, an etch stop layer should be deposited as required and the SiGe alloy on the CMOS region and over the HBT collector contact region will be stripped. The SiGe base is formed to cover the silicon collector, but no critical alignment is necessary.

On the edge of the epi block above the buried oxide, an area denoted by the numeral 325 will be used for the collector contact of the bipolar transistor, as shown in FIG. 3. The reason for collector contact 325 is that this bipolar transistor is formed above the SOI layer 100, so the bulk silicon 10 cannot be used as the collector contact. If space and circuit layer considerations permitted, a group of bipolar transistors having the same collector voltage could share a common body contact to a separated portion of device layer 120, thus eliminating several contact areas 325 and saving space.

It is worth mentioning that by aligning the first STI 140 with the fill oxide 180 as shown in FIG. 3, the bipolar transistors can be completely encapsulated by the oxide, thus achieving device isolation from the substrate. This scheme eliminates the need for deep trench isolation for Si bipolar transistors on a bulk silicon substrate, as used by the prior art, and constitutes a significant cost reduction.

Figure 4:
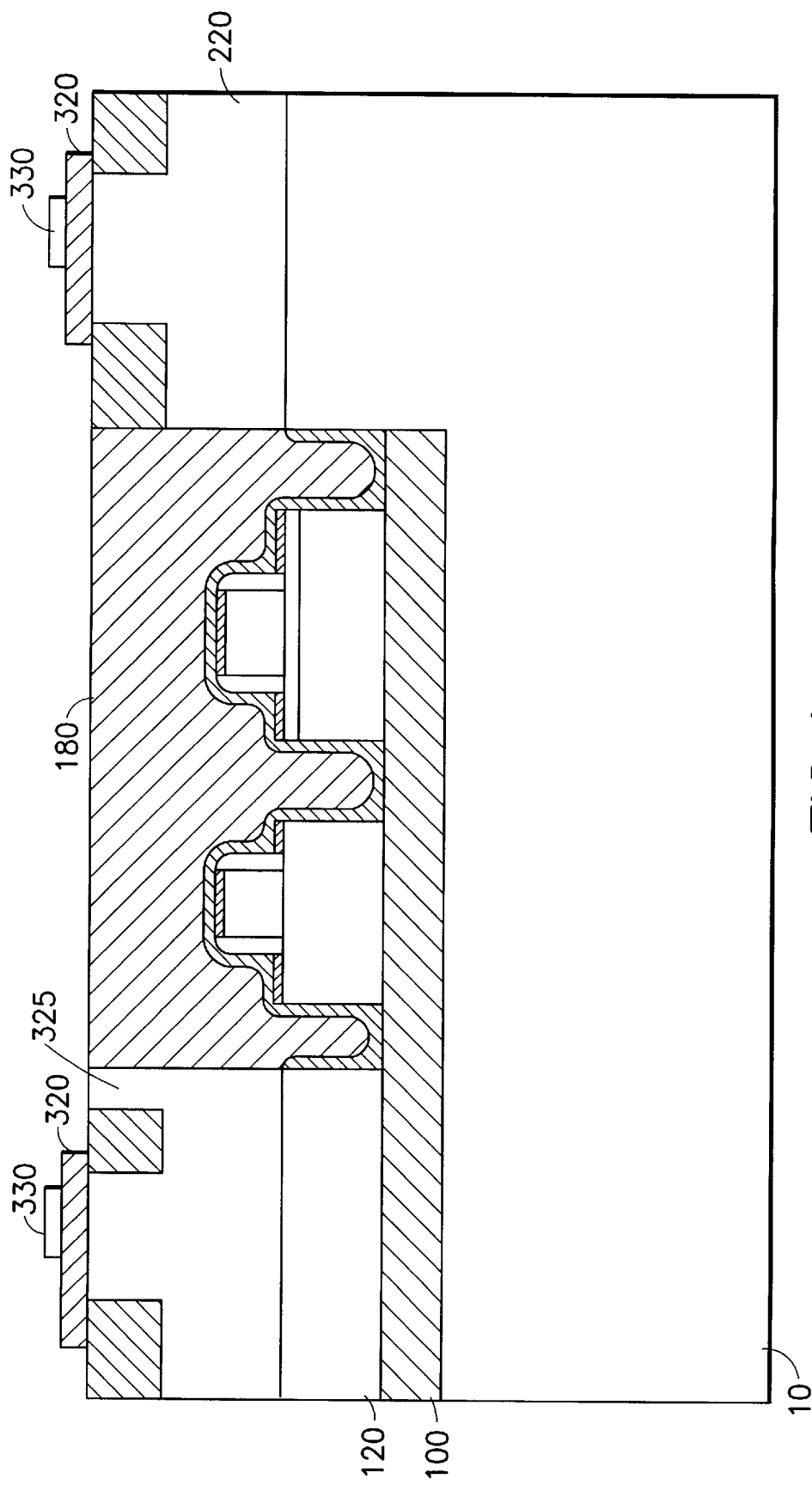

Referring now to FIG. 4, the bipolar transistors have been completed with collectors 220, SiGe bases 320 and polysilicon emitters 330. On the right of FIG. 4, a second bipolar transistor is formed above the bulk silicon 10, with the bulk layer being the collector contact.

The extrinsic base/collector and/or emitter will form self-aligned silicide 476 for a low-resistance contact. As an option, silicide can be formed for CMOS and HBT at the same time, before the TEOS fill and planarization. That will drastically reduce process complexity as compared to a separated silicide process.

Figure 5:
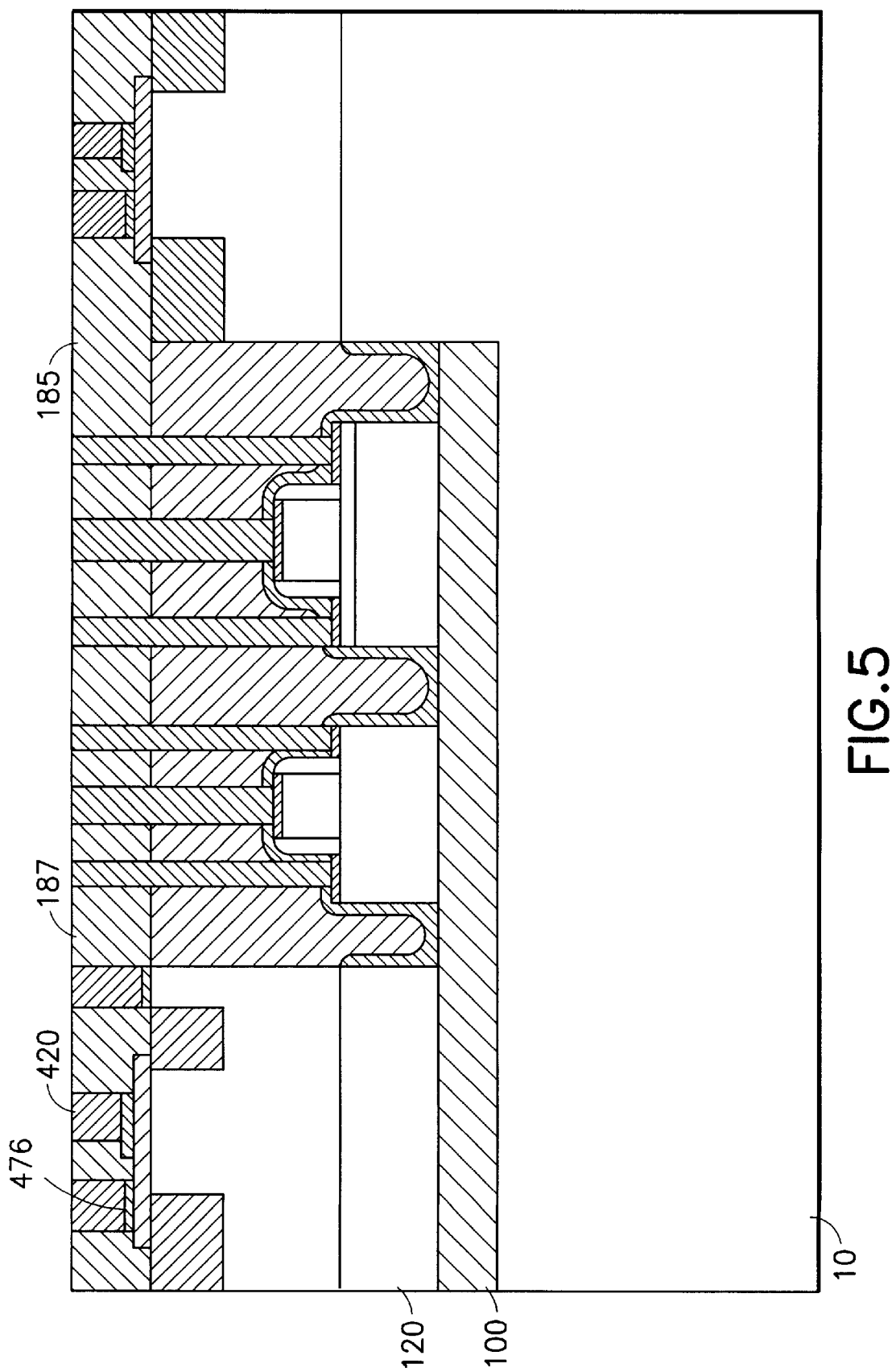

The sets of CMOS and bipolar transistors represented by the examples in the figures are then connected to form the desired circuit. FIG. 5 shows a set of contact vias 420 extending down from a surface 187 in insulator 185 to the bipolar and CMOS transistors. Above surface 187, conventional back end processes may be used to connect up the circuit.

Those skilled in the art will be aware that the level containing the gates could be used for local interconnect, using the same poly that forms the gates, extending between CMOS transistors and/or between a collector and another collector or to a CMOS transistor. Similarly, the level containing oxide 180 could be used for interconnect, either poly or metal. Planarization could be done in this area by using reflow glass instead of chemical-mechanical polishing used for planarization in the preferred embodiment. In FIG. 3, box 189 schematically represents such an interconnect layer.

If desired, the portion of layer 120 below a bipolar collector could be implanted with the appropriate polarity to make it part of the collector and the thickness of layer 220 could be correspondingly reduced.

During the planarization of oxide fill 180, conventional overpolishing reduces the level of the fill in STI 141, bringing the top surface of the fill closer to the top surface of layer 220. Since nitride 222 is initially only 50 nm thick, the step between the top surface of block 220 and the top of the fill is not significant. If the step does affect the deposition of base 320, the remainder of layer 222 could be partially etched and a touchup polish used to remove the excess fill above the top surface of collector 220.

Those skilled in the art will appreciate that various alterations in the processing sequence may be used. Since epitaxial deposition is done at a relatively high temperature, it is preferable, but not essential, that epi layer 220 be deposited before the CMOS transistors are formed. If a particular transistor process has a thermal budget that can stand the temperature, that process could be performed before the epi deposition.

Also, the SiGe layer 320 could be deposited before opening the CMOS area and the polish stop layer 222 could be placed on top of the SiGe.

While the invention has been described in terms of a single preferred embodiment, those skilled in the art will recognize that the invention can be practiced in various versions within the spirit and scope of the following claims.

I claim:

1. A method of forming a BiCMOS integrated circuit containing bipolar transistors in a bipolar region and CMOS transistors in a CMOS region, comprising the steps of:

preparing an SOI silicon substrate above an insulating buried layer, said silicon substrate having a crystalline silicon device layer with a device layer top surface and having a CMOS transistor thickness;

depositing an epitaxial layer of silicon, having an epitaxial layer top surface on said crystalline silicon device layer top surface;

removing said epitaxial layer of silicon above said CMOS area;

forming a set of shallow isolation trenches about transistor sites in said CMOS region;

forming a set of CMOS transistors, having CMOS transistor gates with a top surface, in said transistor sites;

depositing an insulating layer, having an insulating layer top surface, above said device layer in said CMOS region, thereby filling in said set of shallow isolation trenches and areas between said CMOS transistors in said CMOS region;

planarizing said insulating layer and said epitaxial layer so that said epitaxial layer top surface and said insulating layer top surface are substantially coplanar;

forming a set of isolation trenches in said epitaxial layer for isolating terminals of said bipolar transistors;

depositing a layer of SiGe alloy above said epitaxial layer;

forming a set of bipolar transistors using said portions of said epitaxial layer as collectors and portions of said layer of SiGe alloy as bases in said bipolar region; and connecting said CMOS transistors and said bipolar transistors to form said integrated circuit.

2. A method according to claim 1, in which said step of forming a set of shallow isolation trenches about transistor sites and said step of forming a set of isolation trenches in said epitaxial layer are performed simultaneously.

3. A method according to claim 2, in which silicon contact areas of said CMOS transistors and said bipolar transistors are exposed, a layer of metal is deposited and heated to form self-aligned silicide with said exposed silicon contact areas.

4. A method according to claim 3, in which at least one of said collectors is disposed over said insulating buried layer and bounded by shallow isolation trenches, thereby forming an epitaxial collector block and in which said insulating layer surrounds said epitaxial collector block, whereby said epitaxial collector block is encapsulated in insulator and isolated from said silicon substrate.

5. A method according to claim 2, in which at least one of said collectors is disposed over said insulating buried layer and bounded by shallow isolation trenches, thereby forming an epitaxial collector block and in which said insulating layer surrounds said epitaxial collector block, whereby said epitaxial collector block is encapsulated in insulator and isolated from said silicon substrate.

6. A method according to claim 2, in which said steps of depositing an insulating layer above said device layer in said CMOS region and said step of planarizing said insulating layer so that said epitaxial layer top surface and said insulating layer top surface are substantially coplanar are replaced by:
 a step of depositing a first insulating layer above at least said CMOS region and planarizing said first insulating layer to a first insulating layer top surface coplanar with a gate top surface of said CMOS transistor gates;
 depositing a first conductive layer above said first insulating layer top surface and patterning said first conductive layer to form a first interconnect layer connecting at least some of said CMOS transistors; and
 depositing a second insulating layer above said interconnect layer and planarizing said second insulating layer so that said epitaxial layer top surface and said insulating layer top surface are substantially coplanar.

7. A method according to claim 2, further including a step of forming said buried insulating layer in said CMOS region and in a subregion of said bipolar region, whereby at least some of said bipolar region is disposed over said silicon substrate and not over said buried insulating layer.

8. A method according to claim 1, in which silicon contact areas of said CMOS transistors and said bipolar transistors are exposed, a layer of metal is deposited and heated to form self-aligned silicide with said exposed silicon contact areas.

9. A method according to claim 8, in which at least one of said collectors is disposed over said insulating buried layer and bounded by shallow isolation trenches, thereby forming an epitaxial collector block and in which said insulating layer surrounds said epitaxial collector block, whereby said epitaxial collector block is encapsulated in insulator and isolated from said silicon substrate.

10. A method according to claim 8, in which said steps of depositing an insulating layer above said device layer in said CMOS region and said step of planarizing said insulating layer so that said epitaxial layer top surface and said insulating layer top surface are substantially coplanar are replaced by:
 a step of depositing a first insulating layer above at least said CMOS region and planarizing said first insulating layer to a first insulating layer top surface coplanar with a gate top surface of said CMOS transistor gates;
 depositing a first conductive layer above said first insulating layer top surface and patterning said first conductive layer to form a first interconnect layer connecting at least some of said CMOS transistors; and
 depositing a second insulating layer above said interconnect layer and planarizing said second insulating layer so that said epitaxial layer top surface and said insulating layer top surface are substantially coplanar.

11. A method according to claim 8, further including a step of forming said buried insulating layer in said CMOS region and in a subregion of said bipolar region, whereby at least some of said bipolar region is disposed over said silicon substrate and not over said buried insulating layer.

12. A method according to claim 1, in which at least one of said collectors is disposed over said insulating buried layer and bounded by shallow isolation trenches, thereby forming an epitaxial collector block and in which said insulating layer surrounds said epitaxial collector block, whereby said epitaxial collector block is encapsulated in insulator and isolated from said silicon substrate.

13. A method according to claim 12, in which said steps of depositing an insulating layer above said device layer in said CMOS region and said step of planarizing said insulating layer so that said epitaxial layer top surface and said insulating layer top surface are substantially coplanar are replaced by:
 a step of depositing a first insulating layer above at least said CMOS region and planarizing said first insulating layer to a first insulating layer top surface coplanar with a gate top surface of said CMOS transistor gates;
 depositing a first conductive layer above said first insulating layer top surface and patterning said first conductive layer to form a first interconnect layer connecting at least some of said CMOS transistors; and
 depositing a second insulating layer above said interconnect layer and planarizing said second insulating layer so that said epitaxial layer top surface and said insulating layer top surface are substantially coplanar.

14. A method according to claim 12, further including a step of forming said buried insulating layer in said CMOS region and in a subregion of said bipolar region, whereby at least some of said bipolar region is disposed over said silicon substrate and not over said buried insulating layer.

15. A method according to claim 1, in which said steps of depositing an insulating layer above said device layer in said CMOS region and said step of planarizing said insulating layer so that said epitaxial layer top surface and said insulating layer top surface are substantially coplanar are replaced by:
 a step of depositing a first insulating layer above at least said CMOS region and planarizing said first insulating layer to a first insulating layer top surface coplanar with a gate top surface of said CMOS transistor gates;
 depositing a first conductive layer above said first insulating layer top surface and patterning said first conductive layer to form a-first interconnect layer connecting at least some of said CMOS transistors; and
 depositing a second insulating layer above said interconnect layer and planarizing said second insulating layer so that said epitaxial layer top surface and said insulating layer top surface are substantially coplanar.

16. A method according to claim 1, further including a step of forming said buried insulating layer in said CMOS region and in a subregion of said bipolar region, whereby at least some of said bipolar region is disposed over said silicon substrate and not over said buried insulating layer.

* * * * *